United States Patent [19]

Skovmand et al.

[11] Patent Number: 4,642,484
[45] Date of Patent: Feb. 10, 1987

[54] LATCHING COMPARATOR WITH HYSTERESIS

[75] Inventors: Timothy J. Skovmand, San Jose; Michael J. Mottola, Sunnyvale, both of Calif.

[73] Assignee: National Semiconductor Corporation, Santa Clara, Calif.

[21] Appl. No.: 725,042

[22] Filed: Apr. 19, 1985

[51] Int. Cl.⁴ .............................................. H03K 5/153
[52] U.S. Cl. .................................... 307/362; 307/288; 307/542.1
[58] Field of Search .................. 307/247 A, 530, 362, 307/291, 288, 355

[56] References Cited

U.S. PATENT DOCUMENTS 3,946,254  3/1976  Millben ............................ 307/247 A
3,988,595  10/1976  Eatock ................................ 307/362
4,406,955  9/1983  Lo Cascio ........................... 307/362
4,438,349  3/1984  Shoji .................................. 307/362

Primary Examiner—John Zazworsky
Attorney, Agent, or Firm—Gail W. Woodward; Paul J. Winters

[57] ABSTRACT

A latching comparator circuit with hysteresis, including bi-state circuit means responsive to an input signal and to a reference signal for, while in a first state, changing to a second state when the input signal has a first predetermined relationship with the reference signal, and for, while in the second state, changing to the first state when the input signal has a second predetermined relationship with the reference signal. Latch means is included for connection with the bi-state circuit means and is responsive to a control signal for preventing the bi-state circuit means from changing from one of the two states to the other of the two states after the bi-state circuit means changes to the other of the two states.

17 Claims, 9 Drawing Figures

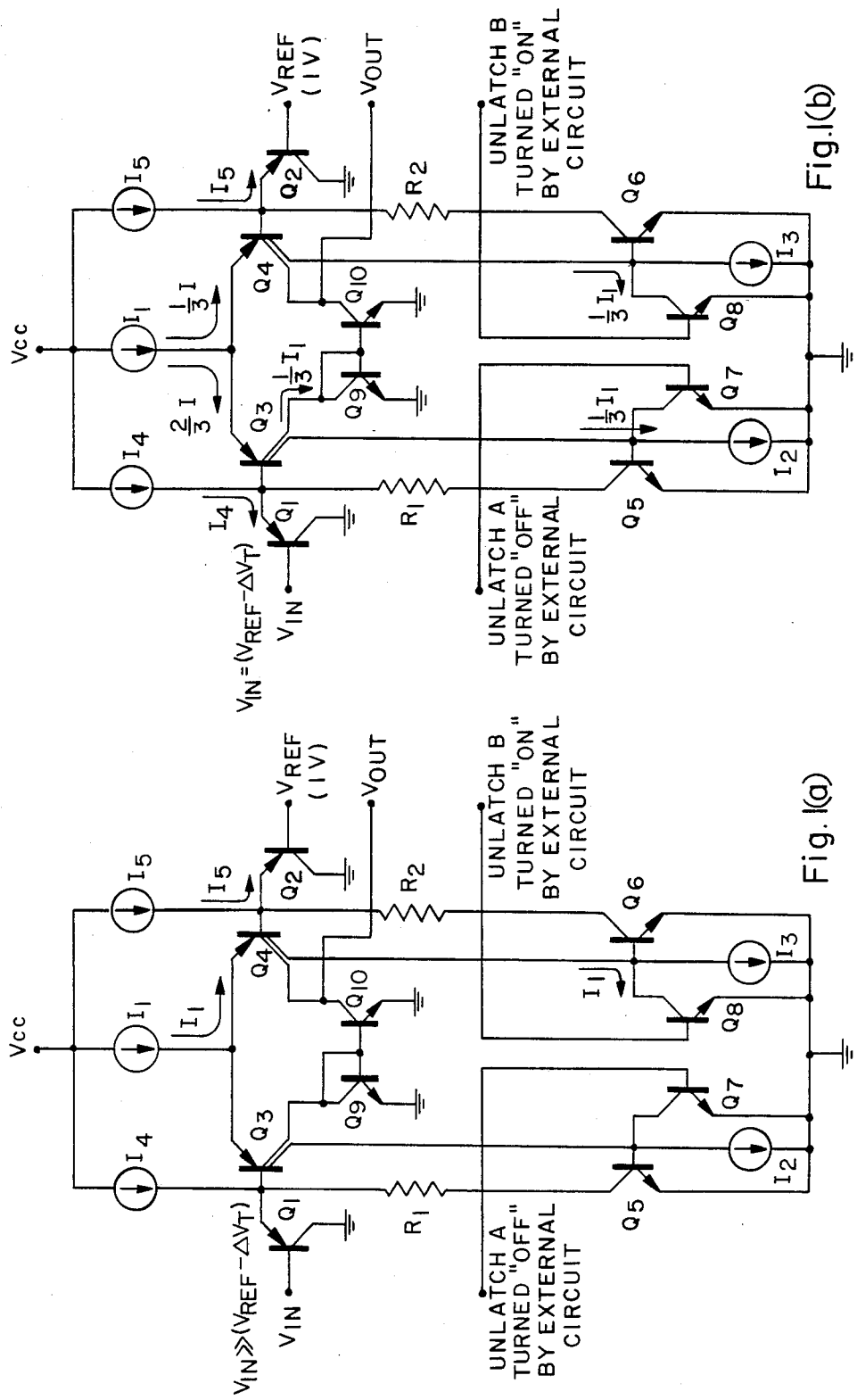

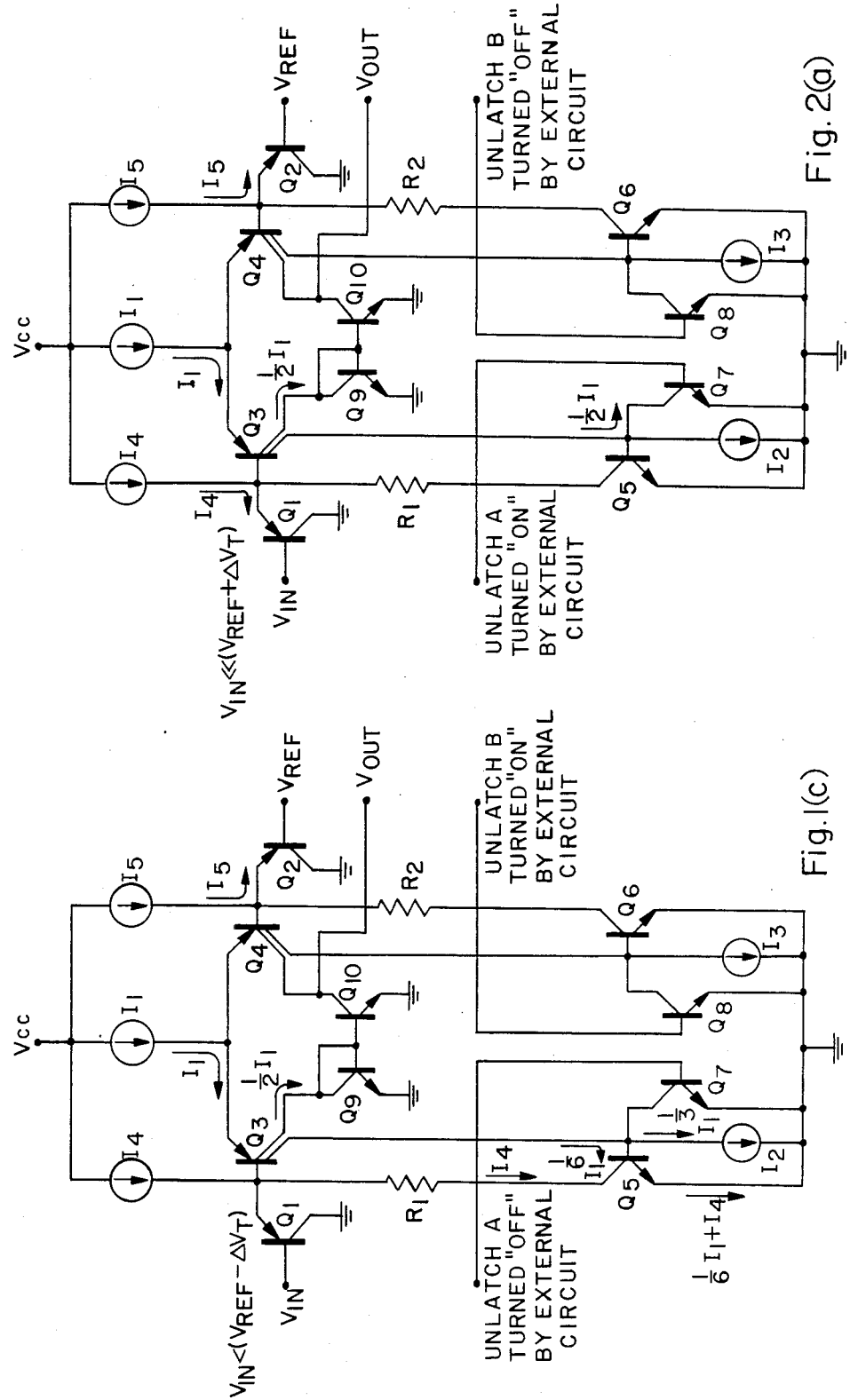

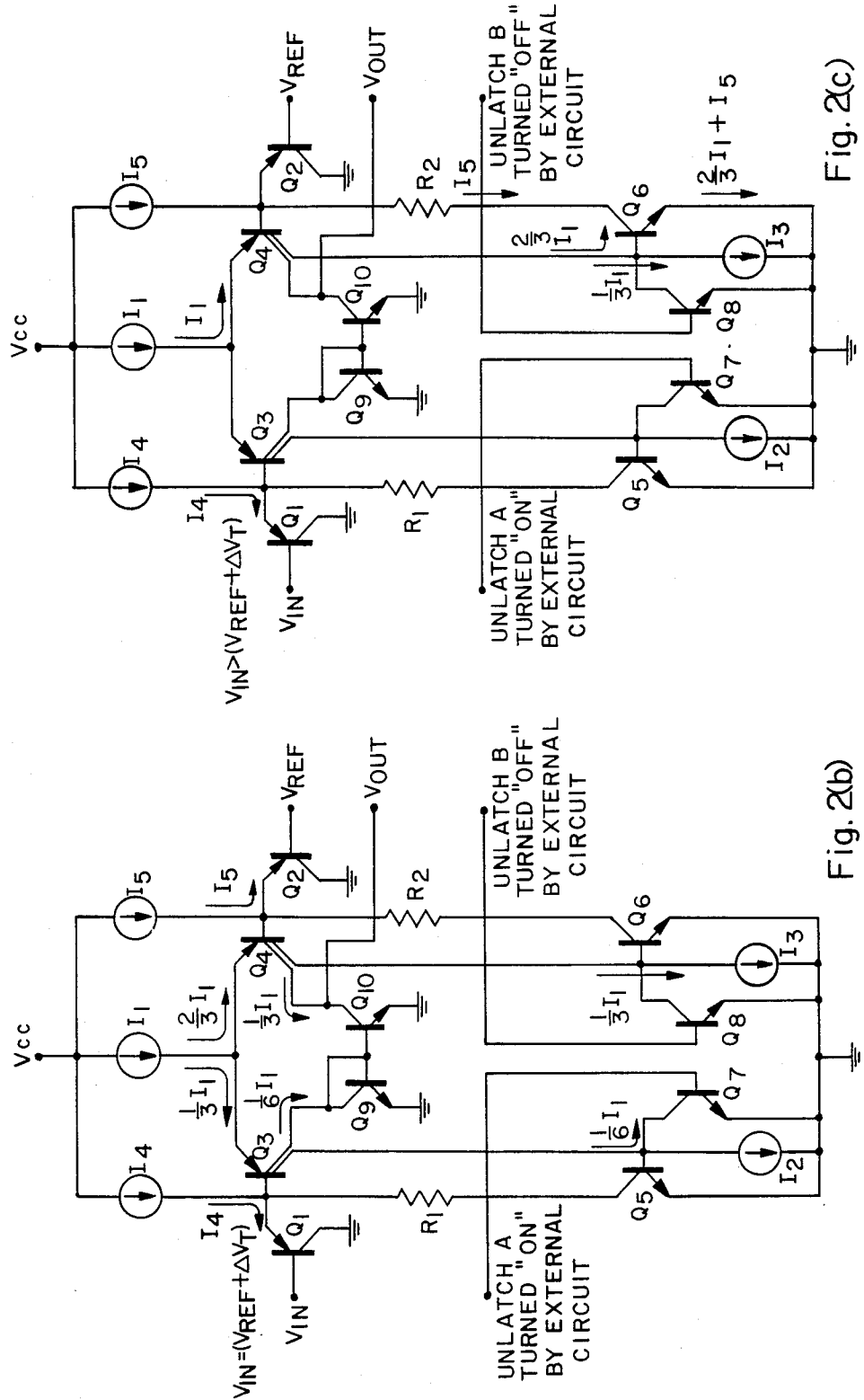

LATCHING COMPARATOR WITH HYSTERESIS

BACKGROUND OF THE INVENTION

The present invention relates to latching comparator circuits. More specifically, the present invention relates to a novel analog voltage comparator circuit having hysteresis latching capability with respect to a reference voltage.

In many applications, it is necessary to provide a circuit which provides an output signal of one of two output levels dependent upon the input signal. In harsh electrical environments such as found in automobile electronics, the input signal may be plagued with switch bounce transients and glitches which could result in erroneous output levels from the comparator circuit. In addition, some amount of hysteresis about a threshold voltage is preferred in the detection of the input signal for changing the state of the output signal.

Latching comparators are known within the digital logic field so as to latch an input data signal, which is either high or low, as an output signal. However, these digital circuits respond only to the predetermined high and low levels of the input signal and are not sufficiently flexible to provide hysteresis about a predetermined reference voltage. In summary, the circuits used in digital logic are ineffective for providing switch debounce capability so as to latch an output signal when the input signal makes a first crossing of a threshold in relation to a reference voltage.

SUMMARY OF THE INVENTION

The present invention discloses a latching comparator circuit with hysteresis that "cleans-up" a signal provided on an input line within the harsh electrical environment such as found in automobile electronics. The present invention looks at the input signal which is provided on the input line through a switch. The action of the switch results in substantial amounts of noise and transients in the input signal during the initial switching action period and the subsequent switch bounce period. The present invention latches upon the initial crossing of a predetermined threshold and ignores the large noise spikes for a predetermined period after the threshold crossing has been reached.

The present invention provides switch debounce capability in addition to having threshold hysteresis about a reference voltage. The threshold hysteresis permits different levels of the input signal to change the output signal level. One threshold would be utilized in changing the output state as the input signal fell from a high voltage to a low voltage. A second and different threshold level would be utilized in changing the output state when the input signal rose from a low level to a high level. The threshold levels are symmetrically located about the reference voltage.

In accordance with the present invention, a latching comparator circuit with hysteresis is disclosed which provides bi-state circuitry which is responsive to an input signal and a reference signal for, while in a first state, changing to a second state when the input signal has a first predetermined relationship with the reference signal, and for, while in a second state, changing to the first state when the input signal has a second predetermined relationship with the reference signal. Latching circuitry is connected to the bi-state circuitry that is responsive to a control signal for preventing the bi-state circuitry from changing from one of the two states to another of the two states after the bi-state circuitry has changed to the other of the two states. In addition, delay circuitry may be coupled to the bi-state circuitry and the latching circuitry so as to provide the control signal to the latching circuitry. The control signal is provided in response to the first and second states of the bi-state circuitry so as to delay, for a predetermined period of time, the enabling of the latch circuitry which has disabled the bi-state circuitry from changing states after a change in states is made.

It is an object of the present invention to provide a latching comparator circuit with hysteresis.

It is yet another object of the present invention to provide a latching comparator circuit with hysteresis latching capability about a reference voltage and delay circuitry for prevent changes in the output voltage for a predetermined period of time after an initial change.

It is yet another object of the present invention to provide a circuit capable of debouncing noise generated by a switch in an input line so as to permit a noise-free signal indicative of the analog input signal.

BRIEF DESCRIPTION OF THE DRAWINGS

FIG. 1 illustrates in FIGS. 1(a)–1(c) a schematic representation of the operation of the present invention in one mode of operation.

FIG. 2 illustrates in FIGS. 2(a)–2(c) a schematic representation of the operation of the present invention in another mode of operation.

DETAILED DESCRIPTION OF THE PREFERRED EMBODIMENT

Figure 3:
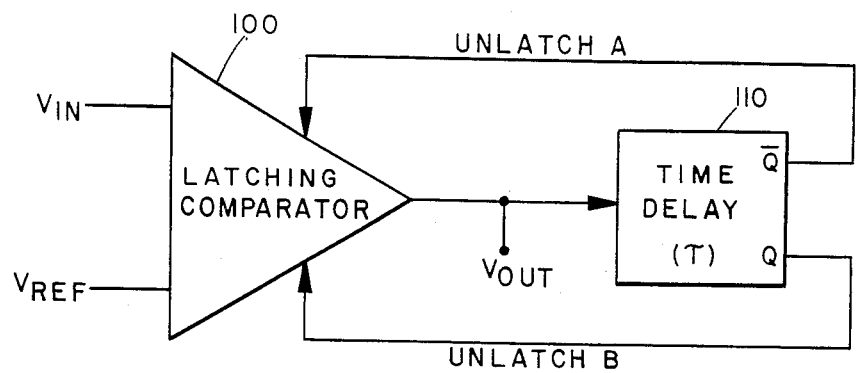
FIG. 3 illustrates the latching comparator circuit of the present invention coupled to a time delay circuit which provides control signals to the latching comparator circuit.

Referring to FIG. 1, there is shown in FIG. 1(a) a schematic representation of the latching comparator circuit of the present invention. A supply voltage, $V_{cc}$, is coupled to the input of current source, $I_1$, and the inputs of current sources, $I_4$ and $I_5$. The emitter of transistor $Q_1$ is coupled to the output of current source $I_4$, the base of transistor $Q_3$, and one end of resistor $R_1$. The collector of transistor $Q_1$ is coupled to ground. The base of transistor $Q_1$ is adapted to receive an input voltage, $V_{IN}$.

Transistors $Q_3$ and $Q_4$ are included as paired transistors to form a differential amplifier. Transistor $Q_3$ has an emitter coupled to the output of current source $I_1$ and the emitter of transistor $Q_4$. Transistors $Q_3$ and $Q_4$ each have a pair of collectors. One collector of transistor $Q_3$ is coupled to the base and collector of transistor $Q_9$, which has its emitter coupled to ground. Transistor $Q_4$ has one collector coupled to the collector of transistor $Q_{10}$, which has an emitter coupled to ground and a base coupled to the base of transistor $Q_9$. The collector of transistor $Q_{10}$ is adapted to provide an output voltage, $V_{OUT}$, from the latching comparator circuit. Transistors $Q_9$ and $Q_{10}$ are configured as a differential to singled-ended turnaround circuit to provide an output from the differential amplifier transistor pair of transistors Q3 and Q4.

The base of transistor Q4 is coupled to the output of current source I5 and the emitter of transistor Q2 and one end of resistor R2. The collector of transistor Q2 is coupled to ground. The base of transistor Q2 is adapted to receive a reference voltage, $V_{REF}$.

The other end of resistor R1 is coupled to the collector of transistor Q5, which has an emitter coupled to ground. The base of transistor Q5 is coupled to the other collector of transistor Q3 in addition to being coupled to the collector of transistor Q7 and the input of current sink I2. The output of current sink I2 is coupled to ground. The emitter of transistor Q7 is coupled to ground while the base is adapted to receive a control signal, UNLATCH A.

The other end of resistor R2 is coupled to the collector of transistor Q6, which has an emitter coupled to ground. The base of transistor Q6 is coupled to the other collector of transistor Q4 in addition to being coupled to the collector of transistor Q8 and the input of current sink I3. The output of current sink I3 is coupled to ground. The emitter of transistor Q8 is coupled to ground while the base is adapted to receive a control signal, UNLATCH B.

In the preferred embodiment of the invention, current sinks I2 and I3 are each capable of sinking up to $\frac{1}{3}$ the amount of current provided by current source I1. The hysteresis in the comparator switching point occurs when one transistor in the differential amplifier transistor pair (Q3 and Q4) passes an amount of current greater than $\frac{1}{3}$ the amount of current provided by current source I1 into either current sinks I2 or I3. At the switching points the amount of current required to overcome one of the current sinks I2 or I3, corresponds to a 2:1 current ratio for the current flowing through transistors Q3 and Q4. Also at the switching points, the difference between transistors Q3 and Q4 base-to-emitter voltages, $\Delta V_{be}$, is approximately 18 mV. The difference in the $V_{be}$'s in transistors Q3 and Q4 can be mathematically expressed as $$\Delta V_{be} = \frac{KT}{q} \ln \frac{I_{c3}}{I_{c4}}$$

where:
K = Boltzman's constant
T = absolute temperature (°K)
q = charge of electron
$I_{c3}$ = transistor Q3 collector current
$I_{c4}$ = transistor Q4 collector current.

At room temperature, KT/q is approximately 0.026 and the ln 2 equals 0.693.

Summarizing, the two switch points will occur approximately ±18 mV around the reference voltage. The hysteresis about the reference voltage at which the switching points occur may be modified by merely designing current sinks I2 and I3, which are of equal current sinking capabilities, to both sink equally greater or lesser amounts of current provided by current source I1.

Figure 4:
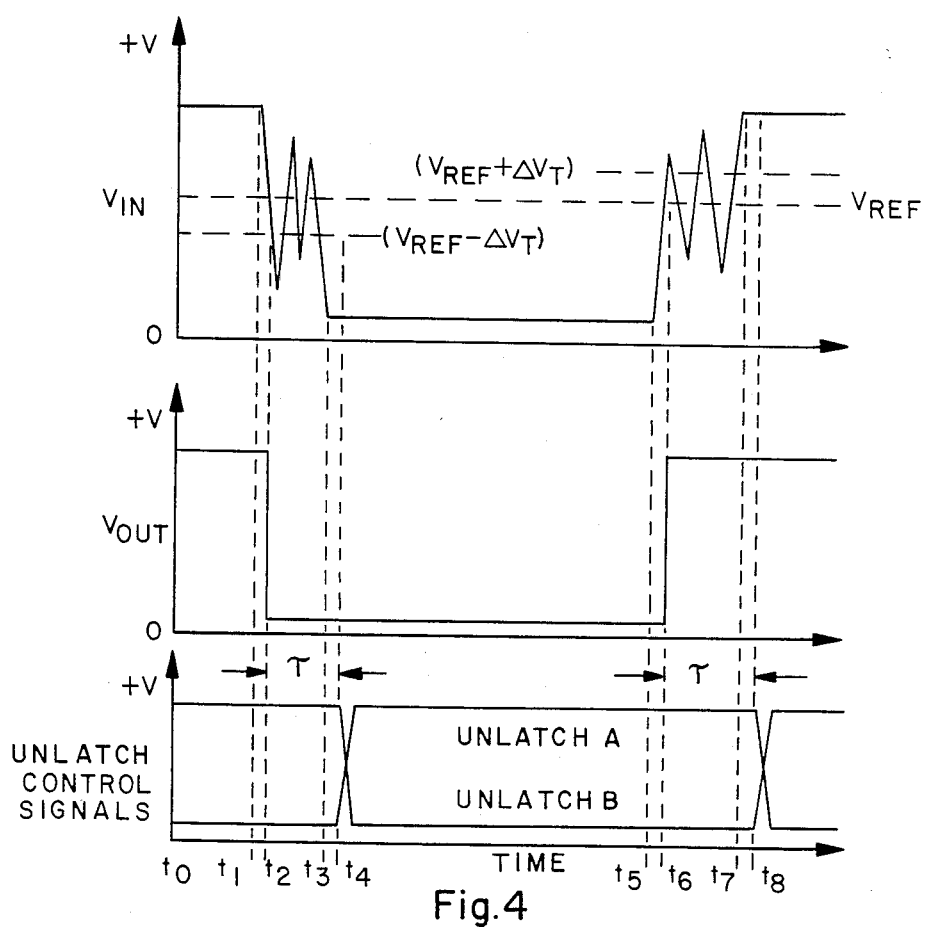
FIG. 4 illustrates by graphical representation the input signal, the output signal, and the control signals associated with the latching comparator of the present invention.

Referring to FIG. 1(a) and FIG. 4, during the time period $t_0-t_1$, the UNLATCH B signal is "high", therefore supplying a current to the base of transistor Q8, which is effectively turned "on". With transistor Q8 turned "on", it is in saturation and effectively holds transistor Q6 turned "off" by diverting all of the current I1 through the collector and emitter of transistor Q8 to ground. During the time period $t_0-t_1$, the input voltage $V_{IN}$ is much greater than the reference voltage $V_{REF}$ which results in the circuit output voltage $V_{OUT}$ being held "high". Since transistor Q6 is turned "off" and the voltage $V_{REF}$ is applied to the base of transistor Q2, current source I5 provides a current through the emitter and collector of transistor Q2 to ground.

At time $t_1$, $V_{IN}$ begins to fall and crosses through the upper threshold, $V_{REF}+\Delta V_T$, and $V_{REF}$ until the time $t_2$ when it reaches the lower threshold level $V_{REF}-\Delta V_T$ which is 18 mV below $V_{REF}$. As $V_{IN}$ falls, transistor Q1 is biased "on" and begins to conduct to ground the current I4 supplied by a current source I4. Correspondingly, as current is conducted through transistor Q1 to ground, the base voltage of transistor Q3 falls such that transistor Q3 begins to conduct a portion of the current I1 in an amount equal to the reduction of current conducted by transistor Q3. For example, when $V_{IN}$ equals $V_{REF}$, the current flowing into the emitter of Q3 equals the current flowing into the emitter of Q4. Therefore, $\frac{1}{2}$ I1 is flowing into the emitter of transistor Q3 with $\frac{1}{2}$ I1 flowing into the emitter transistor Q4. $\frac{1}{4}$ of the current I1 is conducted through one collector of transistor Q3 through current sink I2 to ground. The other $\frac{1}{4}$ of the current I1 conducted through transistor Q3 is supplied down to the base and collector of transistor Q9 but is insufficient to turn on transistor Q9 so as to result in a change in the "high" output voltage at the collector of transistor Q10 which is presently biased "off".

At time $t_2$, $V_{IN}$ has fallen to the lower threshold voltage such that transistor Q3 conducts $\frac{2}{3}$ of the current I1 while the transistor Q4 conducts $\frac{1}{3}$ of the current I1 as illustrated in FIG. 1(b). At this time, $\frac{1}{3}$ of the current I1 is provided to ground through current sink I2 while another $\frac{1}{3}$ of the current I1 is provided to the base and collector of transistor Q9. The $\frac{1}{3}$ of the current I1 being conducted through transistor Q4 is conducted through transistor Q8 to ground.

As $V_{IN}$ falls slightly below the lower threshold, transistor Q3 begins to conduct a proportion of the current greater than $\frac{2}{3}$ of the current I1. Since current sink I2 is only capable of sinking to ground $\frac{1}{3}$ of the current I1, any additional current provided to current sink I2 is forced into the base of transistor Q5 so as to turn "on" transistor Q5. As a result of the base current being supplied to transistor Q5, transistor Q5 goes into saturation and pulls the emitter of transistor Q1 low. This positive feedback forces transistor Q3 to conduct all of the current I1 provided by current source I1. With transistor Q5 saturated, current I4 provided by current source I4 is conducted through the collector to emitter of transistor Q5 along with the base current of approximately 1/6 I1 to ground. In this condition, as illustrated in FIG. 1(c), the comparator circuit is now latched in the "on" state and cannot be unlatched by any change in the input voltage $V_{IN}$. It should be noted that as transistor Q5 begins to conduct, transistor Q9 is provided with a base and collector current equivalent to $\frac{1}{2}$ I1, which sends transistor Q9 into saturation, and provides transistor Q10 is also provided with a base current sufficient to send transistor Q10 into saturation, which results in $V_{OUT}$ going "low".

During the time period $t_2-t_3$, there is an extreme amount of noise or transients on the input line which is reflected in $V_{IN}$. The noise on the input line may exceed the upper and lower threshold levels of a comparator circuit. However, the input line noise is ignored such that $V_{OUT}$ remains at a constant "low" state irrespective of the input noise. At time $t_3$, the noise has subsided from $V_{IN}$ and $V_{IN}$ settles to a "low" state. At time $t_4$, the unlatch control signals change such that the UNLATCH B signal goes "low", and the UNLATCH A signal goes "high". This results in a current turning "on" transistor $Q_7$ while at the same time removing the current from the base of transistor $Q_8$ thereby turning transistor $Q_8$ "off". In this condition, the circuit is now prepared to latch in the other direction. Transistor $Q_7$ goes into saturation and conducts ½ $I_1$ through the collector and emitter to ground, thereby turning "off" transistor $Q_5$. With transistor $Q_5$ turned "off", the current $I_4$ supplied by current source $I_4$ is conducted through transistor $Q_1$ to ground. This condition is illustrated in FIG. 2(a).

During the time period $t_4-t_5$, $V_{IN}$ is held "low" which corresponds to a latched output voltage $V_{OUT}$ also being "low". Also during the time period $t_4-t_5$, the circuit is prepared to latch when $V_{IN}$ rises above the upper threshold $V_{REF} + \Delta V_T$.

At time $t_5$, $V_{IN}$ begins to rise which results in a reduction of the current $I_1$ conducted through transistor $Q_3$ and an equal increase of current conducted through transistor $Q_4$. When $V_{IN}$ equals $V_{REF}$, equal amounts of current are conducted through transistors $Q_3$ and $Q_4$. When $V_{IN}$ equals $V_{REF}$, ½ of the $I_1$ is provided through transistor $Q_3$ with ¼ of the current $I_1$ being provided to ground through transistor $Q_7$ and the other ¼ of the current $I_1$ being supplied to the turnaround circuit of transistors $Q_9$ and $Q_{10}$. In addition ½ of the current $I_1$ is conducted through transistor $Q_4$ with ¼ of the current $I_1$ being conducted through transistor $Q_{10}$ to ground and the other ¼ of the current being supplied to ground by current sink $I_3$.

At time $t_6$, $V_{IN}$ has reached the upper threshold such that transistor $Q_4$ is conducting ⅔ of the current $I_1$ while transistor $Q_3$ is conducting ⅓ of the current $I_1$. This condition is illustrated in FIG. 2(b). With transistor $Q_3$ conducting ⅓ of the current $I_1$, 1/6 of the current $I_1$ is conducted through transistor $Q_9$ which supplies a portion of the base current to transistor $Q_7$ and the other 1/6 of the current $I_1$ is supplied to ground through transistor $Q_7$. ⅔ of the current $I_1$ is conducted through transistor $Q_4$ with ⅓ being conducted to ground through transistor $Q_{10}$. The other ⅓ of the current $I_1$ is conducted through current sink $I_3$ to ground.

As $V_{IN}$ goes slightly above the upper threshold voltage, additional current is supplied through transistor $Q_4$ with a corresponding reduction of current flowing through transistor $Q_3$. A portion of the additional current being conducted by transistor $Q_4$ is provided through a collector which is coupled to current sink $I_3$. This additional portion of current overcomes the current sinking capability of current sink $I_3$ so as to provide the additional portion of current to the base of transistor $Q_6$. The current supplied to the base of transistor $Q_6$ causes transistor $Q_6$ to turn "on" or saturate. As transistor $Q_6$ goes into saturation, the current $I_5$ supplied by current source $I_5$ flows through transistor $Q_6$ along with the base current of transistor $Q_6$ (⅔ of the current $I_1$) to ground. At the point where the current is removed from transistor $Q_3$, transistor $Q_9$ turns "off" which results in the turning "off" of transistor $Q_{10}$, which causes additional current to flow through transistor $Q_6$ and $V_{OUT}$ going "high".

With transistor $Q_6$ conducting ⅔ of the current $I_1$ and current sink $I_3$ conducting ⅓ of the current $I_1$ to ground, the comparator circuit is now latched in an opposite state. During the time period $t_6-t_7$, $V_{IN}$ is subject to noise and transients due to the switch bounce on the input line. At time $t_7$, the noise has subsided and $V_{IN}$ has reached the high level. During the time period $t_6-t_8$, the output of the comparator circuit $V_{OUT}$ is latched at a "high" output voltage. Any changes in $V_{IN}$ will not be reflected in $V_{OUT}$.

At time $t_8$, the noise has subsided with $V_{IN}$ being "high" such that the comparator circuit may be prepared for latching as $V_{IN}$ goes below the lower threshold voltage. At time $t_8$, the UNLATCH A signal goes "low" and the UNLATCH B signal goes "high", thereby placing the circuit in the condition as discussed with reference to FIG. 1(b).

FIG. 3 illustrates latching comparator 100 of the present invention having the output voltage $V_{OUT}$ coupled to time delay 110. Time delay 110 provides the control signal $\overline{Q}$ or UNLATCH A to latching comparator 100. Time delay 110 also provides a Q or UNLATCH B signal to latching comparator 100. Time delay 110 provides the UNLATCH A and UNLATCH B signals in response to the status of latching comparator as indicated by $V_{OUT}$. Upon receiving a change in $V_{OUT}$ from the latching comparator 100, time delay 110 delays for a predetermined period of time, τ, a change in the status of the UNLATCH A and UNLATCH B signals. With reference to FIG. 4 for the time period $t_0-t_2$, $V_{OUT}$ is "high" with UNLATCH A being "low" and UNLATCH B being "high". At time $t_2$, $V_{OUT}$ goes "low" and in response time delay 110 inhibits the changing of the status of UNLATCH A and UNLATCH B signals for the time period τ, which in this case is the time period $t_2-t_4$. At time $t_4$, time delay 110 permits the status of the UNLATCH A and UNLATCH B signals to change with the UNLATCH A signal going "high" and the UNLATCH B signal going "low".

Correspondingly, at time $t_6$, $V_{OUT}$ goes "low" to "high" while the UNLATCH A signal and the UNLATCH B signal are respectively "high" and "low". During the predetermined period of time, in this case the time period $t_6-t_8$, the UNLATCH A and UNLATCH B signals remain unchanged. At time $t_8$, time delay 110 permits the UNLATCH A signal to go "low" and the UNLATCH B signal to go "high". It should be noted that the time period $t_2-t_4$ and the time period $t_6-t_8$ are equal in time duration. The time period τ can be adjusted according to the duration of the input noise at $V_{IN}$. Time delay 110 permits the latching comparator to be disabled after latching for a predetermined period of time τ so as to inhibit a change in the output voltage $V_{OUT}$ during the period that the noise is affecting $V_{IN}$.

Figure 5:
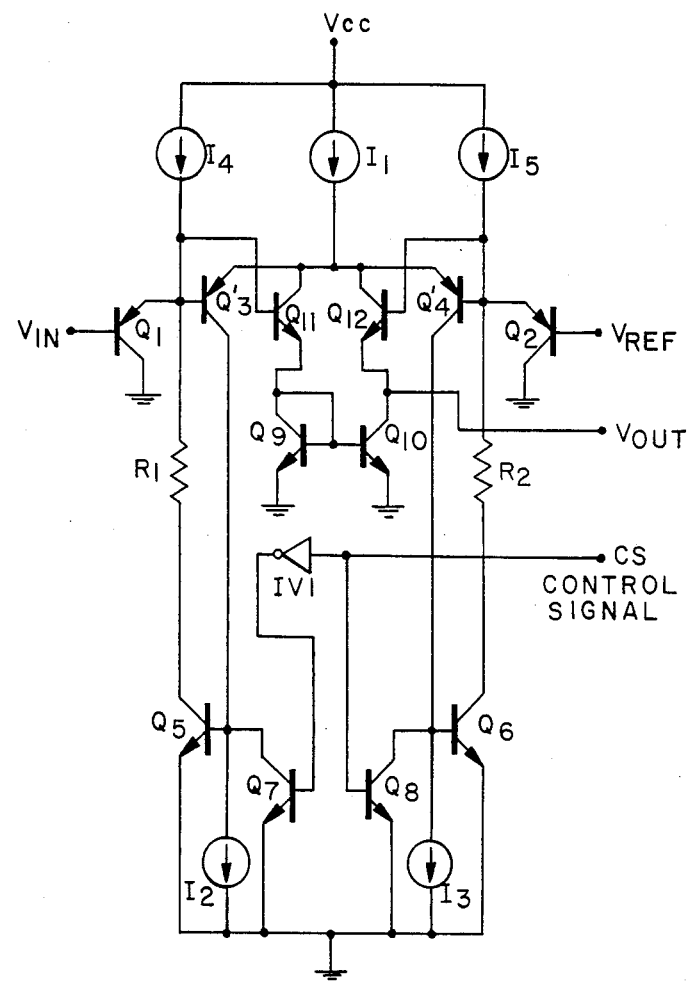
FIG. 5 is a schematical representation of an alternate embodiment of the latching comparator circuit of the present invention.

FIG. 5 illustrates an alternate embodiment of the present invention. In FIG. 5, transistor $Q_3$ and $Q_4$ have respectively been replaced with transistors $Q'_3$ and $Q'_4$ with each having only a single collector. The output circuit now includes transistors $Q_9$, $Q_{10}$, $Q_{11}$, and $Q_{12}$. Transistor $Q_{11}$ has a base coupled to the base of transistor $Q'_3$ while transistor $Q_{14}$ correspondingly has a base connected to the base of transistor $Q'_4$. The collectors of transistors $Q_{11}$ and $Q_{12}$ are connected to the emitters of transistors $Q'_3$ and $Q'_4$. The emitter of transistor $Q_{11}$ is coupled to the collector and base of transistor $Q_9$ with the emitter of transistor $Q_9$ being coupled to ground. The emitter of transistor $Q_{12}$ is coupled to the collector of transistor $Q_{10}$ with the collector of transistor $Q_{10}$ being adapted to provide the output voltage supply $V_{OUT}$. The base of transistor $Q_{10}$ is coupled to the base and collector of transistor $Q_9$. The emitter of transistor $Q_{10}$ is coupled to ground.

A single control signal CS may be supplied at the control signal input which provides a noninverted signal to transistor $Q_8$ and an inverted signal to transistor $Q_7$. The control signal is inverted by inverter $I_1$ as applied to the base of transistor $Q_7$. A single control signal provides the identical function as the UNLATCH A and UNLATCH B signals thereby eliminating the need for two control signals from the time delay unit.

In a preferred embodiment of the invention, input transistors $Q_1$ and $Q_2$ along with the differential amplifier transistor pair $Q'_3$ and $Q'_4$ are transistors of the PNP type. Transistors $Q_5$, $Q_6$, $Q_7$, $Q_8$, $Q_9$, $Q_{10}$, $Q_{11}$, and $Q_{12}$ are transistors of the NPN type. Current source $I_1$, current sources $I_4$ and $I_5$, and current sinks $I_2$ and $I_3$ are all transistorized current sources that are well known in the art of semiconductor circuits. Time delay 110 may be implemented as a JK flipflop having a predetermined period of time delay before changing the output level. Inverter $I_1$ may be implemented as a standard digital logic inverter, such as TTL compatible logic. Although resistors $R_1$ and $R_2$ are included in the preferred embodiment, it is recognized that the circuit will perform adequately without these resistors. Transistors $Q_1$ and $Q_2$ are included and provide input source buffering. Transistors $Q_1$ and $Q_2$ respectively isolate the input signal and reference signal sources from the circuit so as not to pull them to ground during the operation of the circuit.

In the operation of the latching comparator circuit of the present invention, a typical current supplied by current source $I_1$ is equal to 15 uA with current sources $I_4$ and $I_5$ each capable of providing up to 10 uA of current. Current sinks $I_2$ and $I_3$ are each capable of sinking up to 5 uA of current. Resistors $R_1$ and $R_2$ each are 20 K ohm resistors. In relation to voltages, $V_{cc}$ equals 5 volts while $V_{REF}$ equals 1 volt along with $V_{IN}$ ranging from 0 to 5 volts. With $V_{cc}$ equaling 5 volts, it is possible to vary the reference voltage from about 0 volts to about 3 volts. With respect to the threshold levels, it is possible to increase or decrease these levels symmetrically about the reference voltage by designing the current sinking capabilities of current sinks $I_2$ and $I_3$ with respect to the difference in $V_{be's}$ of transition $Q_3$ and $Q_4$. As described herein $V_{REF}$ equals 1 volt, with the upper and lower threshold voltages symmetrically located 18 mV (difference in transistor $Q_3$ and $Q_4$ $V_{be's}$) above and below $V_{REF}$ which corresponds to a 2:1 current ratio in transistors $Q_3$ and $Q_4$. However, it is readily envisioned that the upper and lower threshold levels may be varied by changing variable current sinks $I_2$ and $I_3$ to equally sink greater or lesser amounts of current. It is envisioned that the current ratios in transistors $Q_3$ and $Q_4$ may be increased to approximately a 20:1 current ratio.

The previous description of the preferred embodiments are provided to enable any person skilled in the art to make or use the present invention. Various modifications to these embodiments will be readily apparent to those skilled in the art, and the generic principles defined herein may be applied to other embodiments without the use of the inventive faculty. Thus, the present invention is not intended to be limited to the embodiments shown herein, but is to be accorded the widest scope consistent with the principles and novel features disclosed herein.

What is claimed is:

1. A latching comparator circuit with hysteresis comprising:

differential amplifier means having first and second inputs and first, second, third, and fourth outputs, said first and second inputs for respectively receiving input and reference signals, said differential amplifier means responsive to said input and reference signals for respectively producing first, second, third, and fourth currents at said first, second, third and fourth outputs;

output circuit means coupled to said first and second outputs, said output circuit means having a fifth output and providing at said fifth output an output signal capable of assuming one or another of two states in response to said first and second currents;

first latch control means coupled to said first input and said third output, said first latch control means having a first control signal input for receiving a first control signal, said first latch control means for controlling said first, second, third, and fourth currents, said first latch control means responsive to said first latch control signal such that when said input signal has a first predetermined relationship with said reference signal said output signal changes from said one of said two states to said another of said two states and prevents said output signal from changing from said another of said two states to said one of said two states; and second latch control means coupled to said second input and said fourth output, said second latch control means having a second control signal input for receiving a second control signal, said second latch control means for controlling said first, second, third, and fourth currents, said second latch control means responsive to said second latch control signal such that when said input signal has a second predetermined relationship with said reference signal said output signal changes from said another of said two states to said one of said two states and prevents said output signal from changing from said one of said two states to said another of said two states.

2. The latching comparator of claim 1 further comprising: input buffer means coupled to said first input for receiving and transmitting said input signal to said differential amplifier means wherein said input buffer means isolates said input signal from said differential amplifier means when said output signal changes from said one of said two state to said another of said two states; and reference buffer means coupled to said second input for receiving and transmitting said reference signal to said differential amplifier means wherein said reference buffer means isolates said reference signal from said differential amplifier means when said output signal changes from said another of said two states to said one of said two states.

3. The latching comparator of claim 1 further comprising time delay means coupled to said first and second control signal inputs and said fifth output, said time delay means responsive to said output signal for generating said first and second control signals.

4. The latching comparator of claim 2 further comprising time delay means coupled to said first and second control signal inputs and said fifth output, said time delay means responsive to said output signal for generating said first and second control signals.

5. The latching comparator of claim 1 wherein said first and second predetermined relationship with said reference signal are symmetrical about said reference signal.

6. A latching comparator circuit with hysteresis comprising:
   first and second transistors each having a base, emitter and a pair of collectors;
   constant current source means coupled to the emitters of said first and second transistors, said constant current source means for providing current to said first and second transistors;
   third and fourth transistors each having a base, emitter and collector, said third and fourth transistor base adapted to respectively receive input and reference voltages, and said third and fourth transistor collectors coupled to ground;
   first and second current source means respectively coupled to said third and fourth transistor emitters, said first and second current sources providing current to said third and fourth transistors;
   fifth and sixth transistors each having a base, emitter and collector, said fifth and sixth transistor bases and said fifth transistor collector coupled to one collector of said first transistor collector pair, said sixth transistor collector coupled to one collector of said second transistor collector pair and adapted to provide an output voltage, said fifth and sixth transistor emitters coupled to ground,
   seventh and eighth transistors each having a base, emitter and collector, said seventh transistor collector coupled to said first transistor base, said seventh transistor base and said eighth transistor collector coupled to the other collector of said first transistor collector pair, said eight transistor base adapted to receive a first latch control signal, and said seventh and eight transistors emitters coupled to ground;
   first current sinking means coupled between said seventh transistor base and ground, said first current sinking means for sinking a first predetermined amount of current to ground;
   ninth and tenth transistors each having abase, emitter and collector, said ninth transistor collector coupled to said second transistor base, said ninth transistor base and said tenth transistor collector coupled to the other collector of said second transistor collector pair, said tenth transistor base adapted to receive a second latch control signal, and said ninth and tenth transistor emitters coupled to ground; and
   second current sinking means coupled between said ninth transistor base and ground, said second current sinking means for sinking a second predetermined amount of current to ground.

7. The latching comparator circuit of claim 6 wherein said first, second, third, and fourth transistors are of the PNP type and said fifth, sixth, seventh, eighth, ninth, and tenth transistors are of the NPN type.

8. The latching comparator circuit of claim 6 wherein said first and second current sinking means are each capable of sinking to ground an amount of current up to a predetermined amount of current, said predetermined amount of current being in the range of about one-twenty second to one-fourth the amount of current provided by said constant current source means.

9. The latching comparator circuit of claim 8 wherein said first and second current sinking means are each capable of sinking to ground an amount of current up to about one-third the amount of current provided by said constant current source means.

10. The latching comparator circuit of claim 9 wherein said first and second current source means are each capable of providing an amount of current up to about two-thirds the amount of current provided by said constant current source means.

11. The latching comparator circuit of claim 6 further comprising delay means having a control input coupled to said sixth transistor collector and having first and second control outputs respectively coupled to said eighth and tenth transistor bases, said delay means for, while in a first condition with said output signal in one of two output states, generating said first control signal of one of said two control states and said second control signal of another of said two control states, said delay means changing to a second condition after a predetermined period of time of said output signal changing to another of said two output states, said delay means for, while in said second condition, generating said first control signal of said another of said two control states and said second control signal of said one of said two control states, said delay means changing to said first condition after a second predetermined period of time of said output signal changing to said one of said two output states.

12. A latching comparator circuit with hysteresis comprising:
   first and second transistors each having a base, emitter and collector;
   constant current source means coupled to the emitters of said first and second transistors, said constant current source means for providing current to said first and second transistors;
   third and fourth transistors each having a base, emitter and collector, said third and fourth transistor emitters respectively coupled to said first and second transistor bases, said third and fourth transistor bases adapted to respectively receive input and reference voltages, and said third and fourth transistor collectors coupled to ground;
   first and second current source means respectively coupled to said third and fourth transistor emitters for providing current to said third and fourth transistors;
   fifth, sixth, seventh, and eighth transistors each having a base, emitter and collector, said fifth and sixth transistor collectors coupled to said constant current source means, said fifth and sixth transistor bases respectively coupled to said first and second transistor bases, said fifth and sixth transistor emitters respectively coupled to said seventh and eighth transistor collectors, said seventh transistor collector coupled to said seventh and eighth transistor bases, said eighth transistor collector adapted to provide an output voltage, said seventh and eight transistor emitters coupled to ground;
   ninth and tenth transistors each having a base, emitter and collector, said ninth transistor collector coupled to said first transistor base, said ninth transistor base and said tenth transistor collector coupled to said first transistor collector, said tenth transistor base adapted to receive a first latch control signal, and said ninth and tenth transistors emitters coupled to ground;
   first current sinking means coupled between said ninth transistor base and ground, said first current sinking means for sinking a first predetermined amount of current to ground;

eleventh and twelfth transistors each having a base, emitter and collector, said eleventh transistor collector coupled to said second transistor base, said eleventh transistor base and said twelfth transistor collector coupled to said second transistor collector, said twelfth transistor base adapted to receive a second latch control signal, and said eleventh and twelfth transistor emitters coupled to ground; and second current sinking means coupled between said eleventh transistor base and ground, said second current sinking means for sinking a second predetermined amount of current to ground.

13. The latching comparator circuit of claim 12 wherein said first, second, third, and fourth transistors are of the PNP type and said fifth, sixth, seventh, eighth, ninth, tenth, eleventh, and twelfth transistors are of the NPN type.

14. The latching comparator circuit of claim 12 wherein said first and second current sinking means are each capable of sinking to ground an amount of current up to a predetermined amount of current, said predetermined amount of current being in the range of about one-twenty-second to one-fourth the amount of current provided by said constant current source means.

15. The latching comparator circuit of claim 14 wherein said first and second current sinking means are each capable of sinking to ground an amount of current up to about one-third the amount of current provided by said constant current source means.

16. The latching comparator circuit of claim 15 wherein said first and second current source means are each capable of providing an amount of current up to about two-thirds the amount of current provided by said constant current source means.

17. The latching comparator circuit of claim 12 further comprising delay means having a control input coupled to said eighth transistor collector and having first and second control outputs respectively coupled to said tenth and twelfth transistor bases, said delay means for, while in a first condition with said output signal in one of two output states, generating said first control signal of one of two control states and said second control signal of another of said two control states, said delay means changing to a second condition after a first predetermined period of time of said output signal changing to another of said two output states, said delay means for, while in said second condition, generating said first control signal of said another of said two controls states and said second control signal of said one of said two control states, said delay means changing to said first condition after a second predetermined perod of time of said output signal changing to said one of said two output states.

* * * * *